United States Patent [19]

Lippmann et al.

[11] Patent Number: 5,489,842
[45] Date of Patent: Feb. 6, 1996

[54] METHOD AND APPARATUS FOR DETERMINING THE ROTATIONAL POSITION OF A MAGNETIC ROTOR RELATIVE TO CURRENT CARRYING COILS UTILIZING MAGNETIC COUPLING BETWEEN COILS

[75] Inventors: Raymond Lippmann, Ann Arbor; James E. Nelson, North Branch; Michael J. Schnars, Clarkston; James R. Chintyan, Davison; William J. Johnston, Flint, all of Mich.

[73] Assignee: Delco Electronics Corporation, Kokomo, Ind.

[21] Appl. No.: 58,332

[22] Filed: May 10, 1993

[51] Int. Cl.⁶ .............................. G01R 5/16; G01R 23/00; G01R 1/20
[52] U.S. Cl. .................... 324/144; 324/146; 324/167
[58] Field of Search ................................ 324/143, 144, 324/146, 154 R, 160, 167; 364/424.01, 550, 551.01, 484, 481

[56] References Cited

U.S. PATENT DOCUMENTS

| 3,045,227 | 7/1962 | Minas | 341/173 |
|---|---|---|---|
| 3,113,300 | 12/1963 | Sullivan | 324/173 |
| 3,253,218 | 5/1966 | Mayer | 324/173 |
| 3,562,740 | 2/1967 | Watkins | 340/870.34 X |
| 3,602,811 | 8/1971 | Fales | 324/169 X |
| 3,828,254 | 8/1974 | Burgett et al. | 324/144 |
| 3,946,311 | 3/1976 | Baker et al. | 324/167 |
| 5,004,976 | 4/1991 | Markow et al. | 324/144 X |
| 5,059,916 | 10/1991 | Johnson | 324/143 X |
| 5,093,615 | 3/1992 | Muto et al. | 324/146 |
| 5,309,087 | 5/1994 | Markow et al. | 324/143 X |

FOREIGN PATENT DOCUMENTS

| 1231825 | 11/1960 | France . |
|---|---|---|
| 2432397 | 1/1975 | Germany . |

*Primary Examiner*—Sandra L. O'Shea
*Assistant Examiner*—Jay M. Patidar
*Attorney, Agent, or Firm*—Anthony Luke Simon; Jimmy L. Funke

[57] ABSTRACT

An apparatus includes a rotatably mounted magnetic rotor, a first coil mounted in proximity of the magnetic rotor, the first coil mounted such that, if the coil is flowing with electric current, the magnetic rotor is within immediate proximity of at least part of a magnetic field created by the coil. The apparatus includes a second coil mounted in proximity of the magnetic rotor, the second coil mounted such that, if the coil is flowing with electric current, the magnetic rotor is within immediate proximity of at least part of a magnetic field created by the coil. A current source is coupled to the first coil, for generating an AC signal and applying the AC signal across the first coil whereby an AC output signal develops across the second coil, the AC output signal having a magnitude that varies in relation to the rotational position of the rotor. A measuring circuit detects the AC output signal and develops therefrom a measure of the position of the rotor.

9 Claims, 14 Drawing Sheets

1

METHOD AND APPARATUS FOR DETERMINING THE ROTATIONAL POSITION OF A MAGNETIC ROTOR RELATIVE TO CURRENT CARRYING COILS UTILIZING MAGNETIC COUPLING BETWEEN COILS

The subject of this invention is related to the subject of U.S. patent application Ser. No. 08/058,076 now U.S. Pat. No. 5,410,244, filed concurrently with this application, assigned to the assignee of the application, and the disclosure of which is incorporated herein by reference.

This invention relates to air core gauges and like apparatus, and more particularly to a method for determining the position of a magnetic rotor in an apparatus with at least two coils in proximity to the rotor.

BACKGROUND OF THE INVENTION

Typical analog displays, such as in vehicle instrument panels, utilized air core gauges to position pointers in relation to sensor values. The basic air core gauge mechanism includes a substantially circular disk of magnetized material that is fixed to a spindle and surrounded by at least two coils of wire, with at least one coil typically perpendicular to another of the coils. When electric current passes through the coils, a magnetic field is produced exerting a force on the magnetized disk. The angular direction of the field produced by the coils primarily depends on the number of ampere-turns in each of the coils. The resultant magnetic field produced can be represented by the vector addition of the fields produced by each of the coils.

The basic two coil air core gauge is typically driven by one of two methods. In the first method, shown in FIG. 1, the two coils are designated by reference numerals 36 and 38. Coil 38 is biased to a fixed voltage $V_{ign}$, through load resistor 34. The voltage across coil 36 varies with a signal from variable resistance sensor 32 comprising, with load resistor 30, a voltage divider between $V_{ign}$ and ground. As the voltage across coil 36 varies, the direction of the resultant magnetic field, with which the rotor rotates to align itself, varies.

In the second basic method, shown in FIG. 2, a signal on line 50 from a sensor (not shown), typically a signal with a frequency varying with a vehicle parameter, is converted to an analog signal through circuit 52 and input into a sine, cosine drive circuit 56. The sine/cosine drive circuit 56 generates a signal on line 58 proportional to the cosine of the desired angle of deflection of the rotor and a signal on line 60 proportional to the sine of the desired angle of deflection of the rotor. Coils 62 and 64, in response to the signals on lines 58 and 60, develop magnetic fields with sine and cosine component magnetic vectors correlating to the desired pointer rotation. Various other methods which are not set forth here are also used to drive air core gauges.

Conventional drive methods for air core gauges, including the methods set forth above, are typically open loop systems in which actuation currents are applied to the coils without the use of any feedback information as to the actual pointer position to correct the values of the currents.

Pointer direction errors can arise from many sources. Some of these sources include stray magnetic fields, such as from a nearby radio speaker magnet. To prevent the affect of stray magnetic fields on the gauge, a magnetic shunting enclosure (can) is typically mounted around the coils and rotor of the gauge. The shunting cans must be made from expensive alloys or heat treated to keep from becoming magnetized by the coils, which would also cause errors.

Other pointer direction errors can arise from variances in the diameter of the wire used to wind the coils. As the diameter of the wire changes, the impedance changes, which may cause the current through the wire to change. Pointer direction errors can occur because of unbalanced or heavy pointers. Also, the damping fluid typically used in the air core gauges can cause a mechanical hysteresis which may lead to pointer errors.

Reduction of pointer direction errors is desirable in automotive systems because gauge errors can lead to limits on gauge design, warranty costs for gauges with high inaccuracies, and increased calibration cost to prevent the errors.

SUMMARY OF THE PRESENT INVENTION

The present invention solves the problem of position error in air core gauges by providing an apparatus and method for position sensing of magnetic rotors, enabling the use of feedback to accurately position the pointer of the air core gauge. Although this invention is preferably used with air core gauges, this invention is not so limited and can be used as a general position sensor.

This invention uses a newly discovered phenomenon which is counter-intuitive to knowledge conventionally applied by those skilled in the air core gauge art. Instead of treating the magnetic rotor of the air core gauge as an air gap as is conventionally done by those skilled in the art, the magnetic rotor is used in a novel approach for electronically determining the rotational position of the rotor using a magnetic coupling phenomenon of the magnetic rotor.

In the typical air core gauge, the two coils are mounted substantially perpendicular to each other and have very little magnetic coupling. However, the magnetic rotor of the air core gauge "links" the two coils, encouraging magnetic coupling in a manner dependent upon the relative position of the poles of the magnetic rotor.

An alternating current input signal is placed on one coil and is variably coupled, through the rotor, to the other coil where an AC output signal develops. The degree of coupling, i.e., the ratio between the input and the output signals, is dependent upon the rotational position of the rotor. A measurement of the output signal, or the ratio between the input and output signals, can then be used as an indication of the rotational position of the rotor, and therefore the position of to whatever the rotor is attached.

In the preferred implementation, this invention is used with an air core gauge. The air core gauge may be driven in a conventional manner by a drive signal. An AC input signal is superimposed onto the drive signal for one of the coils of the gauge. The AC input signal is at a frequency high enough that it does not interfere with the DC operation of the gauge. An AC output signal is developed from another coil, depending upon the rotational position of the rotor, and used in a feedback control to adjust the drive signal based upon the positional error of the rotor, if any. The AC output signal has an independent slope/magnitude or an independent phase/magnitude relationship for every rotational position between zero and 90 degrees, and an independent phase/magnitude/slope relationship for every rotational position between zero and 180. The benefit of implementing this invention into an air core gauge is that this invention may be used to provide compensation for the various causes of pointer position error, since the drive signal may be responsively adjusted until the pointer position error equals zero.

Structurally, the apparatus of this invention comprises at least two coils which, if flowing with electric current, create a magnetic field acting on a rotatably mounted rotor. Means for creating an AC input signal is coupled to one of the coils and an AC output signal is developed on another of the coils in relation to the rotational position of the rotor.

The method of this invention comprises applying an AC signal to one of at least two coils of the apparatus and developing an AC output signal on another coil in relation to the rotational position of a magnetic rotor.

Various other improvements and modifications of this invention are set forth in the detailed description below.

DETAILED DESCRIPTION OF THE INVENTION

Figure 1:
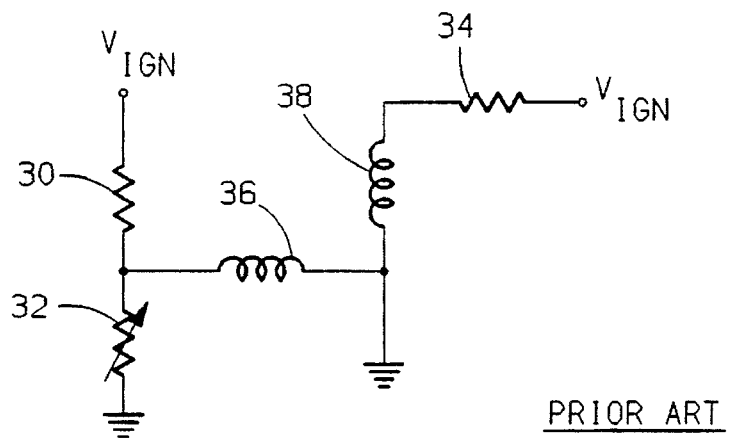
FIG. 1 is one example of a typical method for driving air core gauges.
Figure 2:
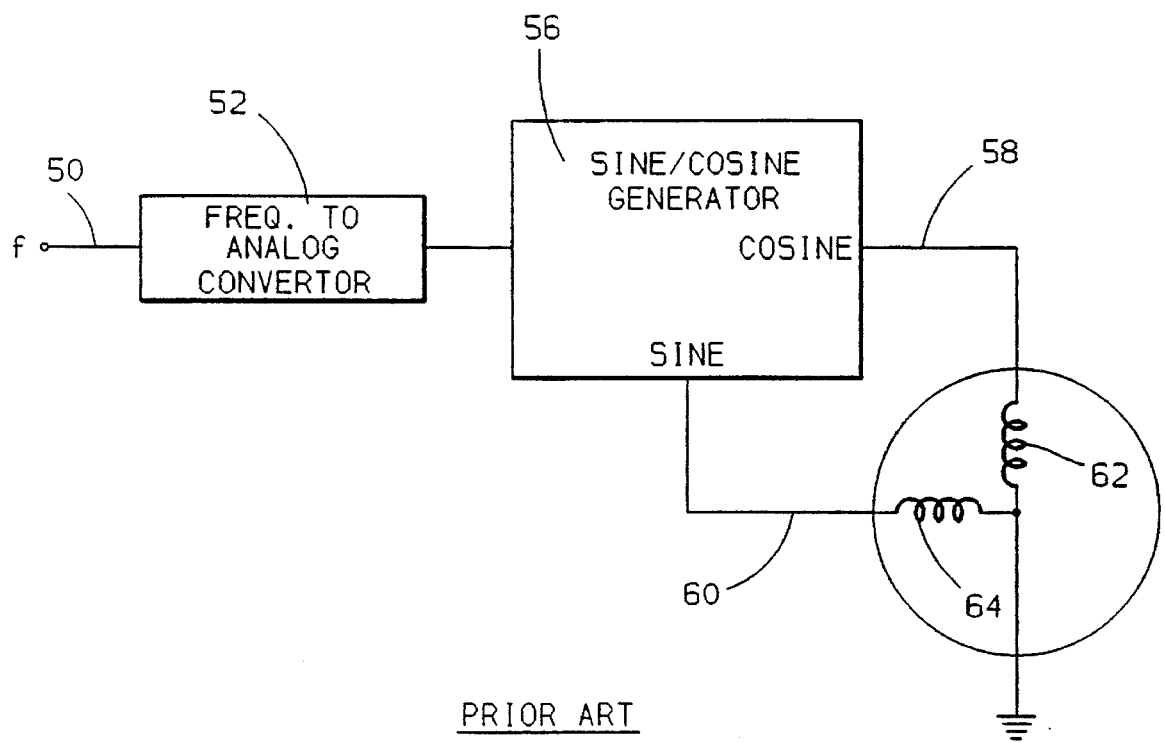
FIG. 2 is a second example of a typical method for driving air core gauges.
Figure 3:
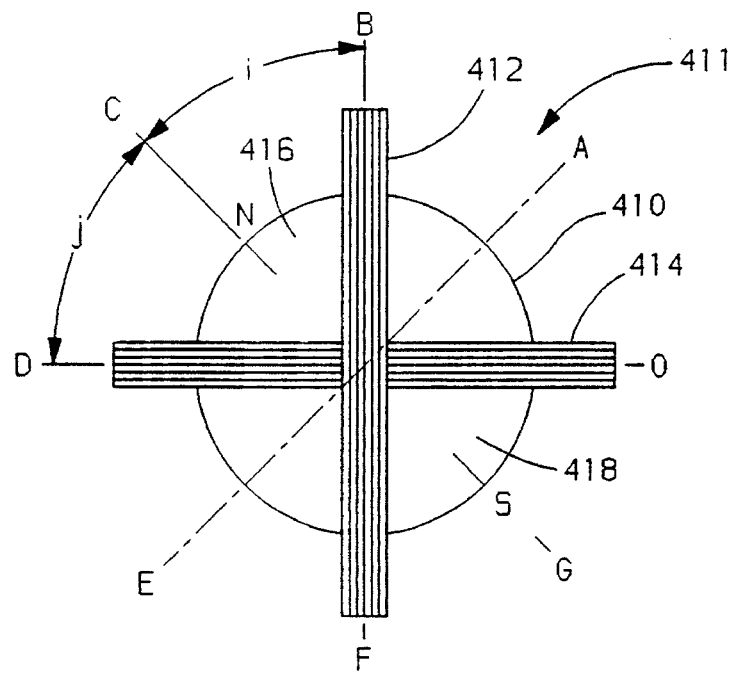
FIG. 3 is a schematic diagram of an air core gauge and the operating principals of this invention.
Figure 4:
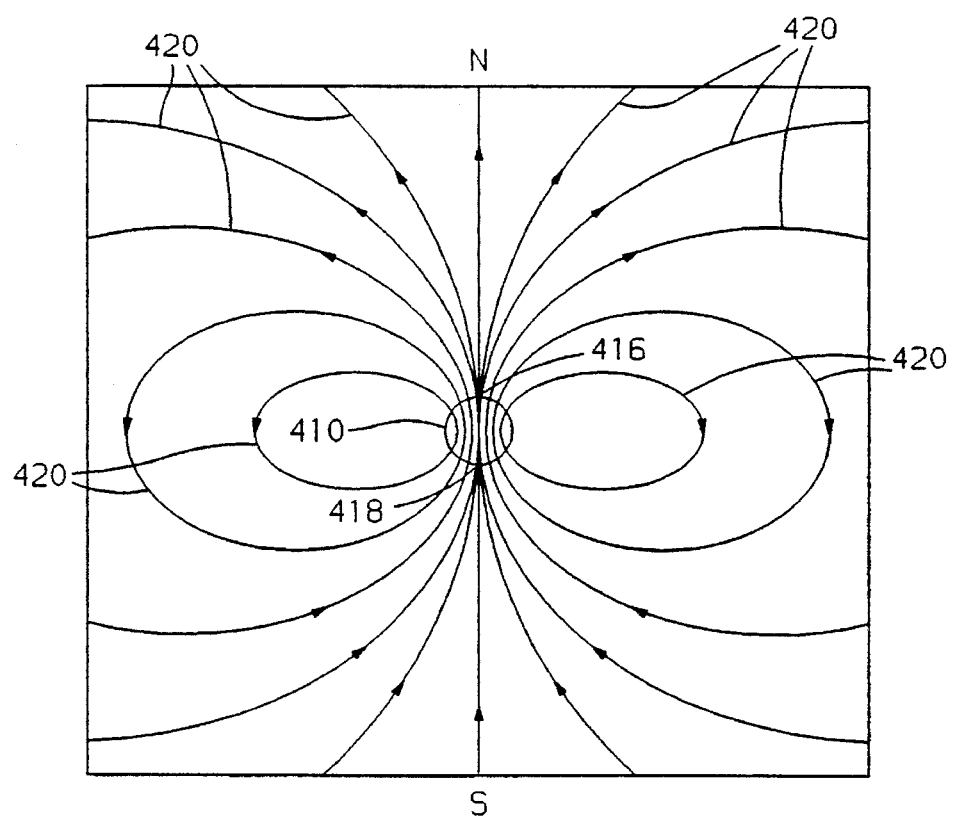
FIG. 4 is an illustration of the magnetic flux patterns of a disk magnet.

FIG. 3 shows a schematic illustration of air core gauge 411, containing coils 412 and 414, which represent two windings of wire typically found in an air core gauge. The two windings are typically wound around perpendicular axes, as shown with coil 412 wound around the 0-D axis and coil 414 wound around the B-F axis. The magnetic rotor 410 of the gauge is typically a disk shaped magnet having North and South poles 416 and 418 as shown. The flux characteristics of a two pole magnetic disk magnet, such as rotor 410, are shown as flux lines 420 in FIG. 4.

With reference to FIG. 3, when rotor 410 is rotated so that the North pole 416 corresponds to position 0, the rotor is at the zero degrees of rotation for purposes of the description below (this zero reference also applies to rotor 86 in FIGS. 7 and 9 below). Likewise, when rotor 410 is rotated so that North pole 416 corresponds to positions A, B, C, D, E, F and G, the rotor 410 is at the 45, 90, 135, 180, 225, 270 and 315 degree positions, respectively.

In accordance with the principals upon which this invention operates, coils 412 and 414 of the gauge 411 may be charged with a normal rotation drive signal to affect an angular rotation of the rotor 410. Coil 412 is additionally coupled to an AC signal source so that an AC input signal is superimposed onto the portion of the drive signal in coil 412. If coils 412 and 414 are perfectly perpendicular, there is no magnetic coupling of the AC input signal from coil 412 to 414. However, rotor 410 has a magnetic flux linkage to each coil, and hence provides a magnetic flux linkage between coils 412 and 414, inducing a coupled AC output signal (referred to below as the "AC output signal") on coil 414 in response to the AC input signal on coil 412. Since the rotation drive signal is substantially DC, the rotation drive signal does not cause signal coupling between coils 412 and 414.

The flux linkage between coil 412 and rotor 410 is proportional to sin(i), where i is the angle between North pole 416 (or South pole 418) and a line drawn through points B and F. The flux linkage between coil 414 and rotor 410 is proportional to sin(j), where j is the angle between North pole 416 (or South pole 418) and a line drawn through points D and 0. Since magnetic fluxes are vectors and are additive, rotor 410 links the two coils with a flux linkage proportional to sin(i)sin(j).

Figure 5:
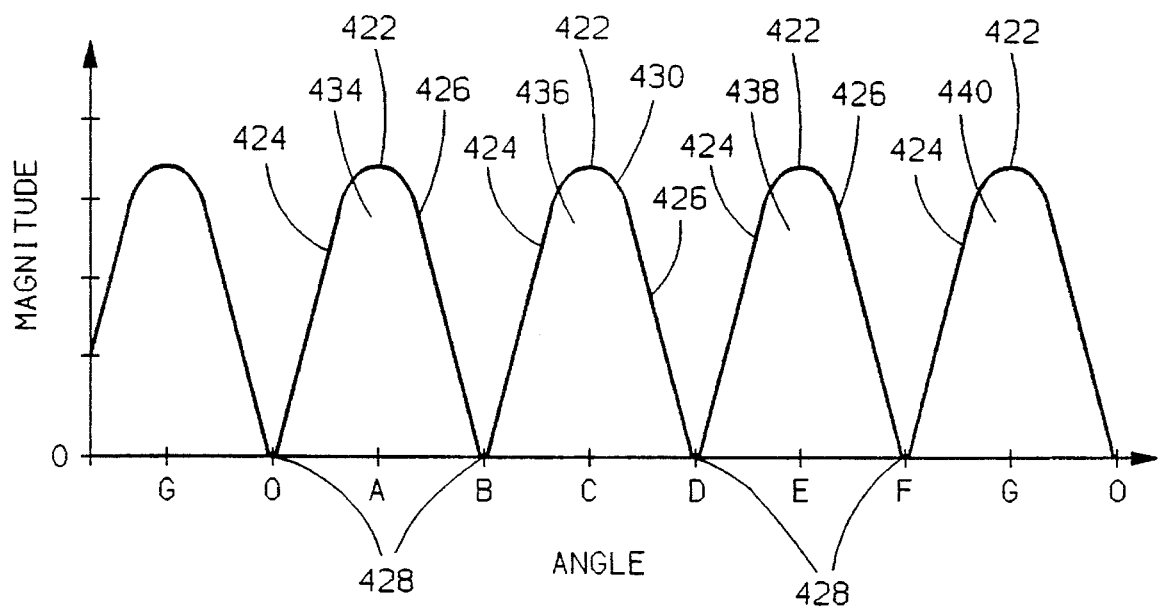
FIG. 5 is an illustration of the magnitude of a coupled AC output signal in an ideal gauge.

With the flux linkage between coils 412 and 414 dependent upon the rotational position of rotor 410, the magnitude of the AC output signal in coil 414 is also dependent upon the rotational position of rotor 410. FIG. 5 illustrates, relative to the angle of rotation of rotor 410, the magnitude of the AC output signal in coil 414 for an ideal gauge with perfectly perpendicular coils and a perfectly symmetrical magnetic rotor.

In FIG. 5, curve 430 represents the magnitude of the AC output signal verses the angle of rotation. As North pole 416 is rotated between points 0, A, B, C, D, E, F and G, the magnitude 430 has four minimums 428, four maximums 422, four periods of positive slope 424 and four periods of negative slope 426. Through the rotation, curve 430 has four equal lobes, 434, 436, 438 and 440. The minimums 428, where the coupled AC output signal is virtually zero, occur at points 0, B, D and F, which are 90 degrees apart and correspond to the position of the North and South poles 416 and 418 when they are parallel to either of the axes of coils 412 or 414. The maximums 422 of the magnitude in the AC output signal occur at points A, C, E, and G and are 90 degrees apart, and ideally 45 degrees from each adjacent minimum 428.

Figure 6:
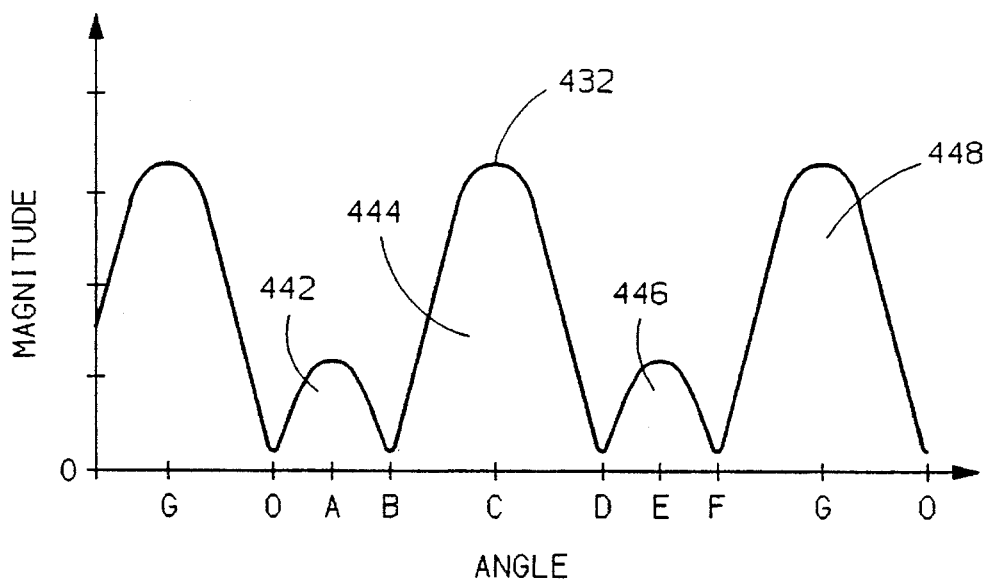
FIG. 6 is an illustration of the magnitude of a coupled AC output signal in either a non-ideal gauge or a gauge in a phase-shifting circuit.

FIG. 6 represents a magnitude curve 432 of the AC output signal in a non-ideal gauge. If, for example, coils 412 and 414 are not exactly perpendicular, the four lobes 442, 444, 446 and 448 of the curve will not be equal. The four minimums may be shifted so that they are not exactly 45 degrees from the adjacent maximums. Additionally if the magnetic rotor is not exactly symmetrical, as in one pole having a higher flux density than the other pole, then the four lobes of the curve 432 will be unequal and the minimums may be shifted as shown. Although the lobes are unequal and the minimums are shifted, lobes 442 and 446 are equal to each other in height and width and lobes 444 and 448 are equal to each other in height and width.

Another factor that can affect the characteristics of the AC output signal is the circuitry connected to the gauge coils. If the circuitry implemented causes a phase shift in the AC signal the minimums may be shifted and the lobes may become uneven as shown in FIG. 6.

Figure 7:
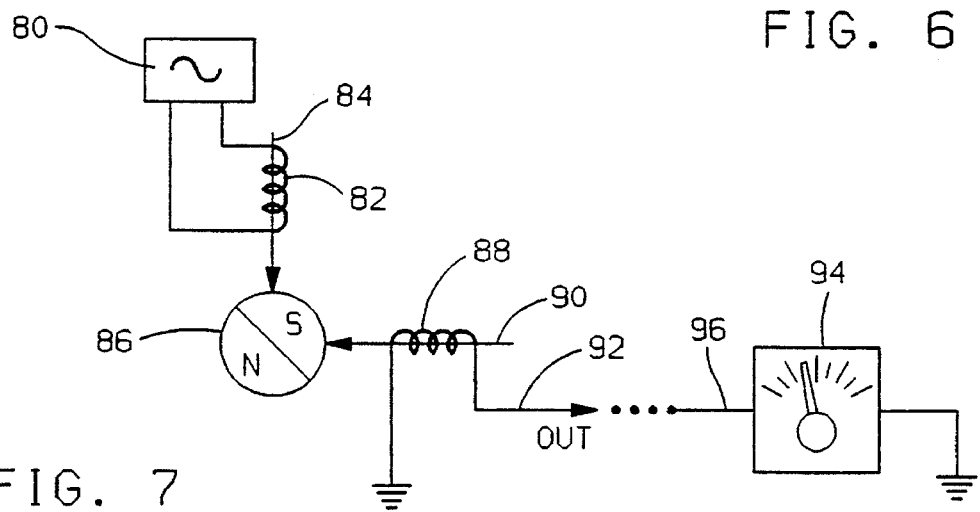
FIG. 7 is an illustration of the method and apparatus of this invention.

Referring to FIG. 7, the apparatus of this invention includes AC signal source 80, coils 82 and 88, and magnetic rotor 86. The coils 82 and 88 are placed so that if each coil is flowing with electric current, a magnetic field is produced by each coil, parallel to lines 84 and 90, in immediate proximity to rotor 86. The preferred implementation is to mount the coils 82 and 88 so that, if they are flowing with electric current, the magnetic fields produced by each coil are substantially perpendicular. The magnetic rotor 86 comprises a two pole magnet, is preferably a round disk, though not necessarily so, and is rotatably mounted by any suitable means on an axis fixed relative to coils 82 and 88.

The rotor 86 is mounted so that its rotational position varies with a parameter. Examples include the rotor 86 mounted to a wheel to sense the position of the wheel, or the rotor mounted to a steering wheel shaft, to sense steering wheel position, or the rotor being the rotor of an air core gauge to sense the position of the gauge pointer. In short, anywhere a rotational position sensor may be used, this invention may be used.

AC signal source 80, easily implemented by one skilled in the art, supplies an input AC signal to coil 82, which tends to generate magnetic fields through coil 82 parallel to arrow 84. The frequency of the AC signal is preferably between 20 and 40 Khz, where it is high enough not to generate audible noise in coil 82 and low enough not to generate significant radio frequency interference. Although 20 to 40 Khz is the preferred range, this invention operates well with signals both above and below the preferred range. As described further below, the AC input signal may be summed with any other signal applied to coil 82.

The magnetic fields generated by coil 82 are coupled by magnet 86 to coil 88, causing an AC output signal to be developed in coil 88. Normally, where two coils generate perpendicular fields, there is no coupling between the two coils. According to this invention, however, magnet 86 can induce coupling between the two coils 82 and 88 in relation to the rotational position of magnetic rotor 86. Depending upon the position of rotation of magnet 86, the magnitude and phase of the AC output signal developed in coil 88 varies.

Figure 8A:
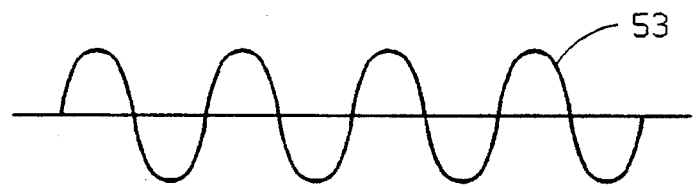
FIGS. 8a, 8b and 8c illustrate example AC input signal and example AC output signals, in-phase and out-of-phase.
Figure 8B:
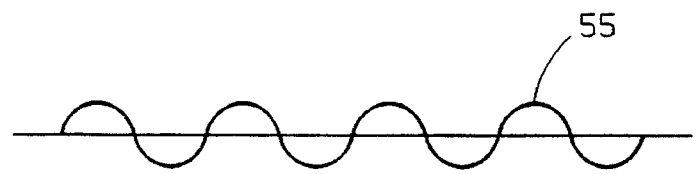
Figure 8C:
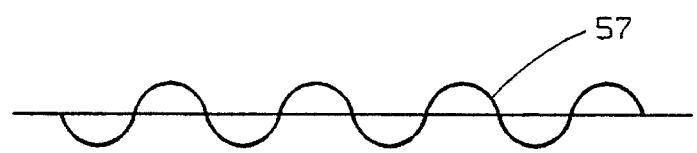

The range of the ratio of the AC output signal magnitude to the AC input signal magnitude (output signal to input signal ratio) varies depending upon the position of the coils. The broadest range of output signal to input signal ratio is achieved if coils 82 and 88 are substantially perpendicular to each other. Although this invention does work if coils 82 and 88 are not perpendicular to each other, the performance in such situations is not as optimal. The phase of the AC output signal may be the same as the phase of the input signal or opposite, having a 180 degree phase shift. FIGS. 8*a*, 8*b* and 8*c* show an AC input signal 53, an example AC output signal 55 in phase with input signal 53, and an example AC output signal 57 having a phase opposite to that of the input signal 53.

The AC output signal developed in coil 88 can be detected by various means across coil 88, e.g., between line 92 and ground, and may be used for a variety of purposes as an indication of the rotational position of rotor 86. A simple implementation of means of detecting the AC output signal is shown in FIG. 7, where the signal on line 92 may be coupled to line 96, the input of AC signal meter 94, which can display the position of rotor 86 through movement of a pointer, in response to the magnitude of the AC signal on line 92.

Figure 9:
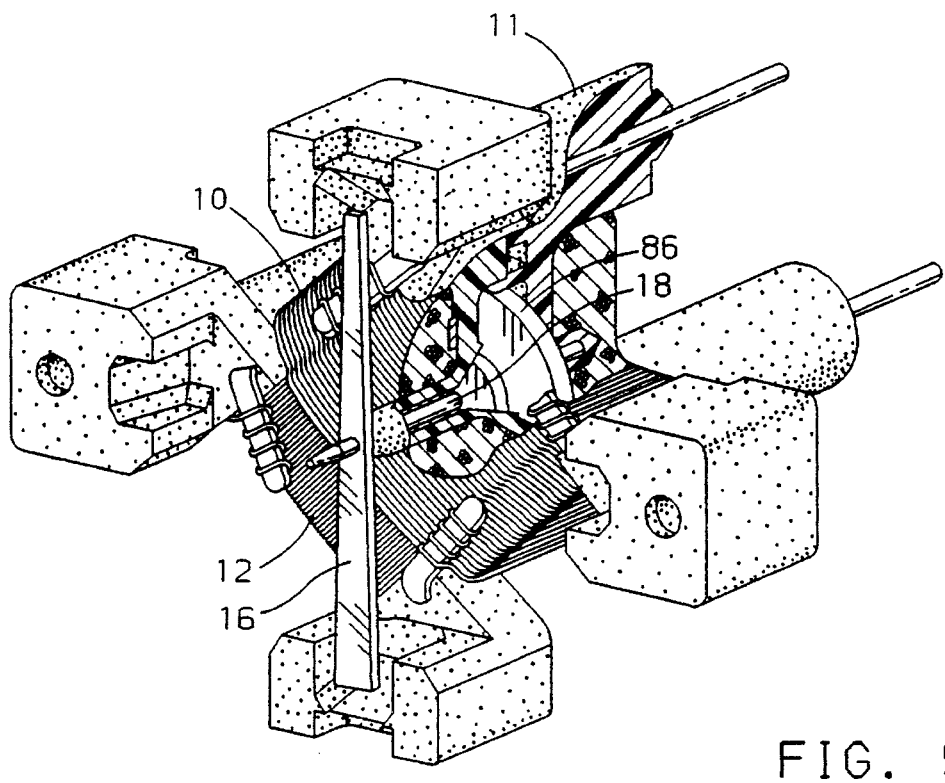
FIG. 9 is an illustration of an air core gauge in which this invention may be implemented.

FIG. 9 shows an air core gauge with which this invention is preferably implemented. The gauge shown has coils 10 and 12, coil 10 is perpendicular to and cross wound over coil 12 as shown, both coils being wound around bobbin 11, which is typically constructed of plastic. Within the windings of both coils of the gauge is magnetic rotor 86, here a two pole magnet of the preferred round cylinder shape. The magnetic rotor 86 is preferably constructed from a material such as a polymer bonded ferrite, glass ferrite, Alnico™, or any other equivalent material, and magnetically charged into a permanent magnet. The rotor 86 is affixed to spindle 18, which is rotatably mounted within the bobbin 11. Pointer 16 is affixed to the end of the spindle 18 so that the pointer 16 moves as the spindle rotates. The gauge may have a pointer return means (not shown), such as a spring, biasing magnet, or a weight, so that the pointer returns to a predetermined position when no current flows through coils 10 and 12.

Figure 10:
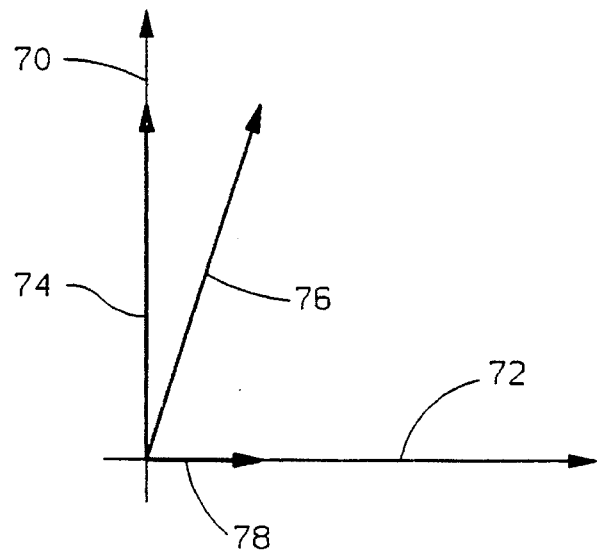
FIG. 10 is a vector diagram illustrating magnetic fields produced by an air core gauge.

In basic operation, substantially DC electric current is applied to coils 10 and 12, which create magnetic fields in response to the current through the coils. The magnetic fields add together forming a composite magnetic field, with a composite magnetic vector, with which magnetic rotor 86 rotates to align itself. FIG. 10 is an example vector diagram pertaining to operation of the gauge shown in FIG. 9. Generally, one of the coils creates a magnetic vector 78 in a first direction 72, and the other coil creates a magnetic vector 74 in a second direction 70. The resultant magnetic vector with which the rotor aligns itself is vector 76, of which vectors 74 and 78 are component vectors.

Figure 11:
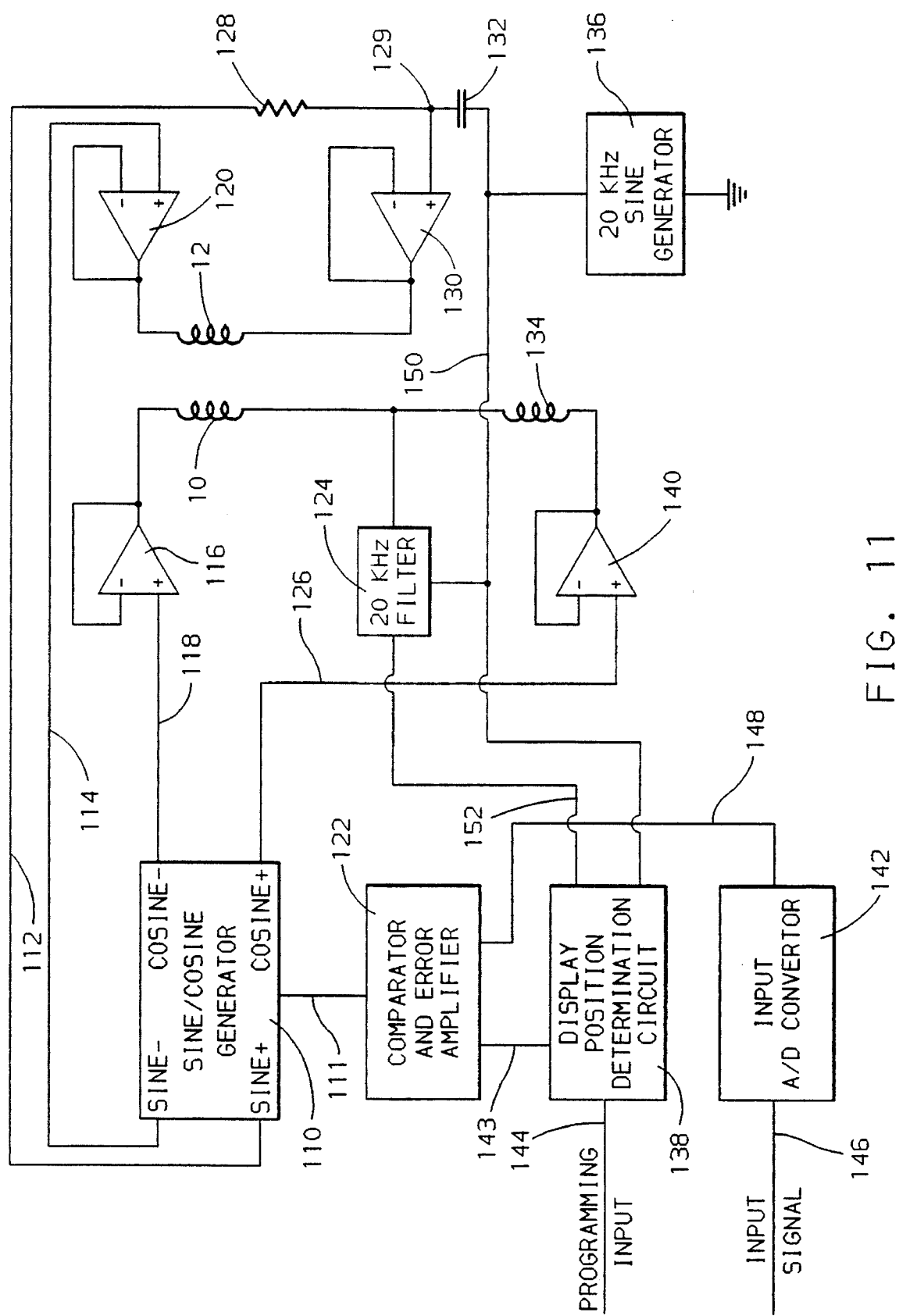
FIG. 11 is an illustration of a preferred implementation of this invention.

This invention is preferably used with the gauge of FIG. 9 connected into the circuit of FIG. 11 as shown. In FIG. 11, an input signal is supplied on line 146 from a sensor (not shown). The signal may be any type of input signal, but for purposes of explanation, a varying voltage signal, such as from sender 32 is assumed, and the signal is filtered, if necessary. A/D converter 142 converts the signal to a digital signal, which is output on bus 148. The digital signal on bus 148 is fed to one side of a comparator/error amplifier 122. The other side of the comparator/error amplifier 122 is fed with a signal on line 143 representing the current position of the rotor 86 (and pointer 16). The comparator/error amplifier 122, in response to the signals on buses 143 and 148, outputs a signal on to the sine/cosine generator 110, which comprises the means for supplying substantially DC current.

The sine/cosine generator 110 adjusts its output signals on lines 112, 114 and 118, 126, in response to the error signal from the comparator/error amplifier 122. The sine/cosine generator 110 supplies a voltage between lines 112 and 114 that is a substantially DC signal and represents the sine of the angle of the composite magnetic vector which is desired to be generated by coils 10 and 12. Likewise, the sine/cosine generator supplies a voltage between lines 118 and 126 that is a substantially DC signal and represents the cosine of the angle of the composite magnetic vector which is desired to be generated by coils 10 and 12.

The signal on line 114 is coupled, through unity gain amplifier 120, to one terminal of coil 12 of the gauge. The signal on line 112 is coupled through dropping resistor 128 and unity gain amplifier 130 to the other terminal of coil 12 of the gauge. Through these connections, current having a substantial DC component, flows through coil 12 creating a magnetic field having a vector comprising the sine component of the desired composite magnetic vector.

Likewise, the signal on line 118 is coupled, through unitary gain amplifier 116 to one terminal of coil 10. The signal on line 126 is coupled, through unitary gain amplifier 140 and inductor 134 to the other terminal of coil 10. Through these connections, current having a substantially DC component flows through coil 10 creating a magnetic field having a vector comprising the cosine component of the desired composite magnetic vector. Inductor 134 acts as a low pass filter and has virtually zero effect on the signal supplied by lines 118 and 126.

AC signal generator 136 generates an AC signal at, for example, 20 Khz, on line 150. The AC signal on line 150 is coupled through capacitor 132, to line 129, and from there, through amplifier 130, to coil 12. Resistor 128 isolates the dc level signal on line 129 from the output of sine/cosine generator 110. The resultant current through coil 12 is a sine wave signal with a varying DC offset, the DC offset controlled by the voltage difference between lines 112 and 114.

An AC signal appears on coil 10. The magnitude and phase of the signal on coil 10 depends upon the rotational position of magnetic rotor 86 (FIG. 9). If the rotor 86 is a two pole magnet, there is exactly one output magnitude/phase combination for each position of the rotor through 90 degrees of rotation and one output magnitude/phase/slope combination for each position of the rotor through 180 degrees of rotation.

In order to resolve 360 degrees, quadrant detection can be implemented by sensing the drive current in coils 10 and 12. Quadrant detection assumes that the rotor is in the quadrant that it is driven to. The quadrant information can be used together with the magnitude, phase, and/or slope information to determine rotor position.

The AC signal developed across coil 10 is filtered by filter 124. The center point of filter 124 may be designed to track the frequency of the AC signal generator 136 so that AC signal generator 136 need not be precise. To aid in this tracking, line 150 may be fed to filter 124. Construction of filter 124 may be easily accomplished by one skilled in the art.

The filtered signal output by filter 124 appears on line 152 and is fed into position circuitry 138. The signal developed by the AC signal generator 136 on line 150 is also fed into the position circuitry 138.

Figure 12:
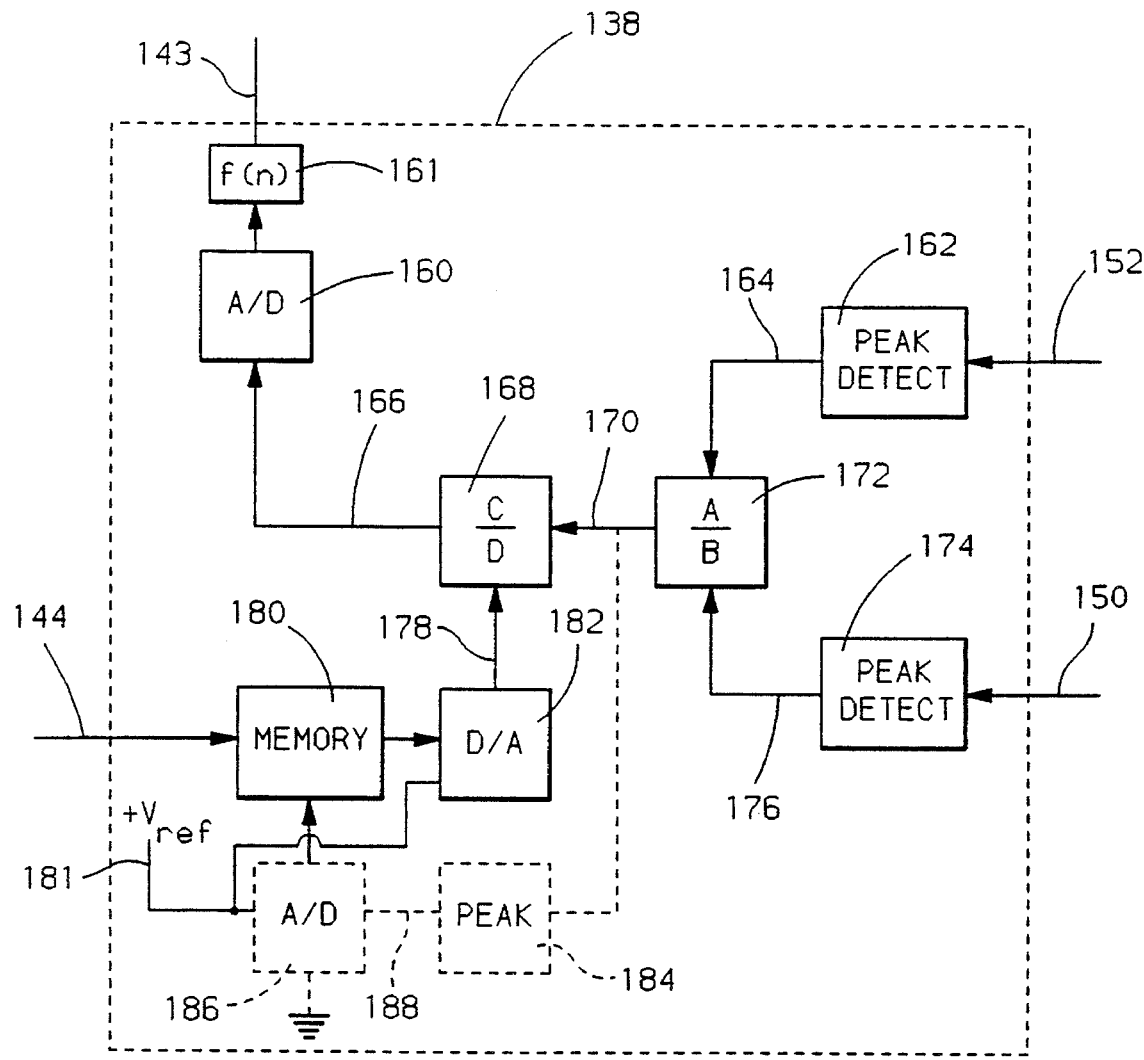
FIG. 12 is an schematic diagram of position circuitry 138 in FIG. 11.

One example of the position circuitry 138 is shown in FIG. 12 and comprises peak detectors 162 and 174, memory 180, D/A converter 182, ratio circuits 168 and 172, and A/D converter 160. The signals on lines 152 and 150 are input to peak detectors 162 and 174, respectively. The detected peak signals are output on lines 164 and 176 and input into ratio circuitry 172, which takes the ratio of the peak amplitude signal from coil 10 over the peak amplitude signal from coil 12. The ratio is used to eliminate the effects of the varying sine wave amplitudes due to fluctuations in the power supply for AC signal generator 136. The ratio developed in ratio circuitry 172 is output on line 170 and input into ratio circuitry 168. Ratio circuitry 168 ratios the output of ratio circuitry 172 to the maximum ratio, supplied on line 178.

The maximum ratio on line 178 is developed either from a test routine that may be performed during manufacture of the vehicle instrumentation, or during an initiation cycle of the circuitry, which may be run each time the vehicle is started. The test routine sends a test signal on line 146 (FIG. 11) that varies from the minimum input signal to the maximum input signal, cycling the gauge and rotor 86 through all pointer positions. During the routine, the ratio of the signal on lines 152 and 150, on line 170, is monitored, e.g., through peak detector 184, where the peak is detected and output on line 188 to A/D converter 186. The peak of the signal on line 170 during the test routine is the maximum ratio and is converted into a digital signal, e.g., through A/D converter 186, and programmed into memory 180, with a programming pulse on line 144. If the test routine is only run during vehicle manufacture, peak detector 184 and A/D converter 186 may be external circuits.

The maximum ratio, stored in memory 180, is supplied on line 178 via D/A converter 182. Line 166, the output of the ratio circuitry 168, is equal to line 181 ($V_{ref}$) when line 170 is equal to line 178, is generally less than line 181 when line 170 is less than line 178, and is equal to zero when line 170 is equal to zero. Line 166, is fed into A/D converter 160, then to function generator 161, and output on bus 143. The signal on bus 143 is both a measure of the AC output signal and an indication of rotor 86 (and pointer 16) position (rotor position signal). Bus 143 supplies the rotor position signal to the comparator/error amplifier 122 (FIG. 11), which alters the substantially DC sine and cosine drive signals to coils 10 and 12 if the signal on bus 143 indicates improper positioning of rotor 86.

Figure 13:
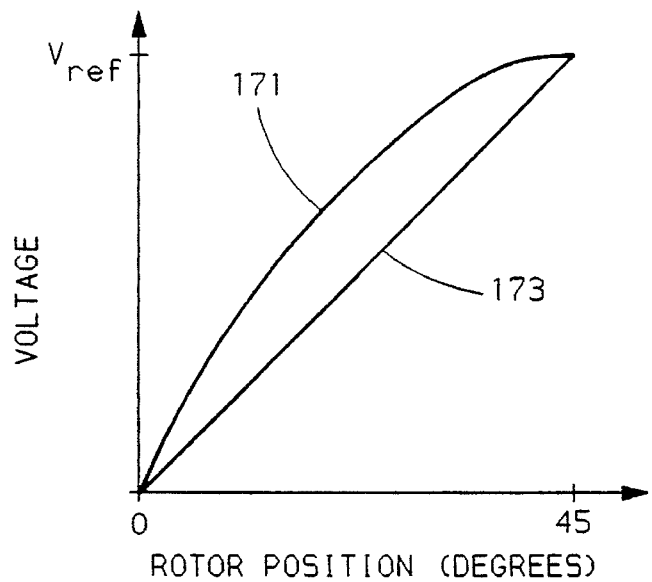
FIG. 13 illustrates an output signal of the circuit shown in FIG. 12.

The above circuitry provides an independent pointer position signal for the first 45 degrees of pointer rotation. FIG. 13 illustrates the magnitude of the output signal on line 166 (reference 171) in relation to the rotational position of the rotor. Function generator 161 may comprise a look-up table to linearize the signal on line 166 as indicated by reference 173.

Figure 14:
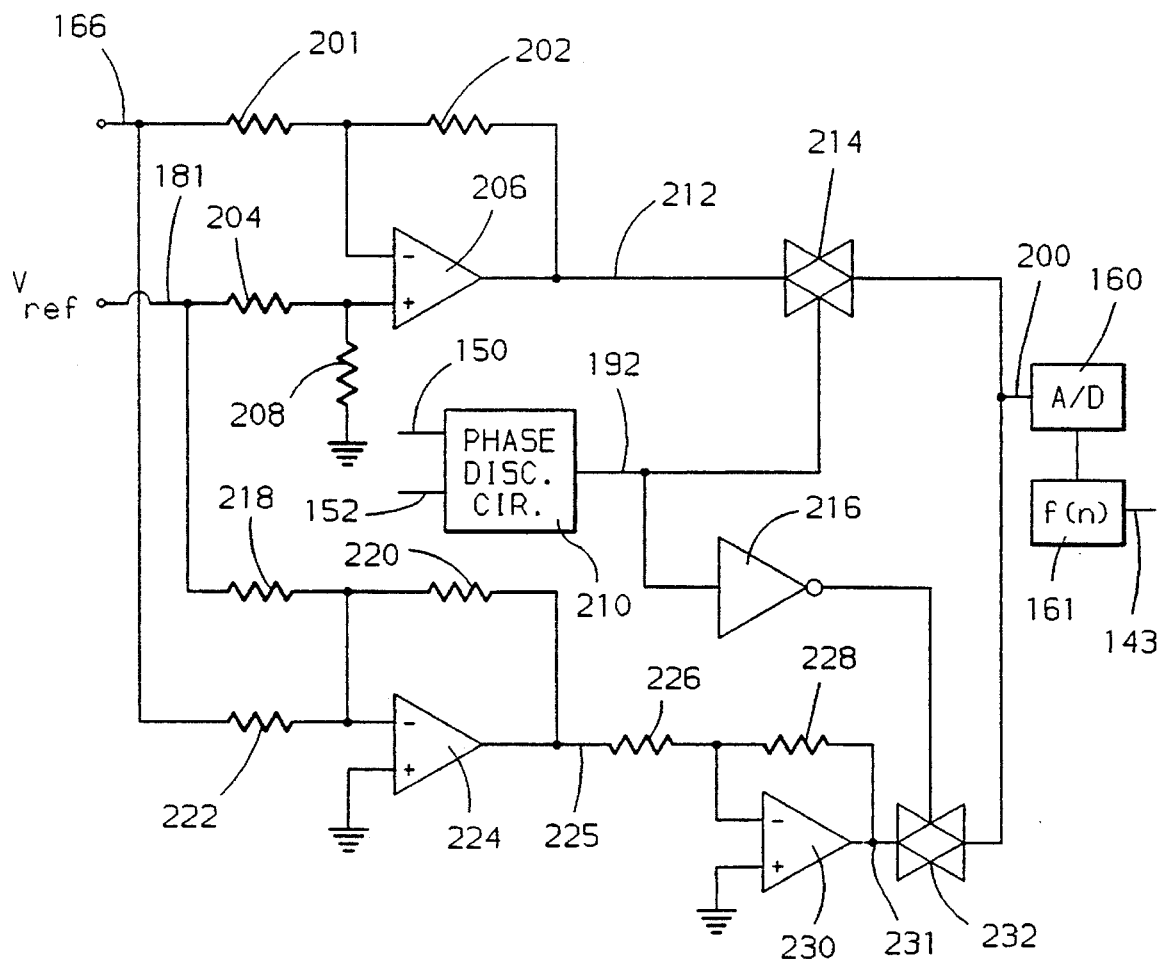
FIG. 14 illustrates additional position circuitry for use with this invention.

An independent pointer position signal for 90 degrees of pointer rotation may be accomplished with circuitry that incorporates phase discrimination circuitry between the input sine wave signal on line 150 and the output sine wave signal on line 152. FIG. 14 illustrates circuitry that, when added to the circuitry of FIG. 12, enables closed loop position control for the first 90 degrees of pointer rotation.

The circuitry in FIG. 14 is coupled between line 166 of FIG. 12 and A/D converter 160. In general, the apparatus of this invention incorporating the circuitry in FIG. 14 detects both magnitude and phase of the gauge feedback signal and provides an output signal with an independent value for the first 90 degrees of rotation of the air core gauge.

More specifically, the input and output sine wave signals on lines 150 and 152 are input to phase discrimination circuitry 210, which outputs a signal on line 192 that is high when the two signals are in-phase and low when the two signals are out-of-phase. The signal on line 166, which is the ratio of the input to output magnitudes (FIG. 12), is provided to the circuitry relating to amplifiers 206 and 224. Amplifier 206 and associated resistors 201, 202, 204 and 208, all having the same resistance, subtract the signal on line 166 from the reference signal on line 181. Line 181 is the same voltage reference signal to which A/D converter 186 and D/A converter 182 in FIG. 12 are referenced. The output of amplifier 206 on line 212 equals $V_{REF}-V_{166}$. Lines 181 and 166 are also input through summing amplifier 224 and associated resistors 218, 220 and 222, all of equal resistance. Amplifier 224 provides an output signal on line 225 equal to $-(V_{REF}+V_{166})$. Because the summing amplifier 224 inverts the sum of the signals on lines 166 and 181, inverting amplifier 230 and resistors 226 and 228 are implemented to re-invert the signal and output the signal on line 231 equal to $V_{REF}+V_{166}$.

The phase discrimination signal on line 192 controls transmission gate 214 directly and controls transmission gate 232 via invertor 216. Transmission gates 214 and 232 couple either the signal on line 212 ($V_{REF}-V_{166}$) or the signal on line 231 ($V_{REF}+V_{166}$) to line 200, depending on whether the input and output signals on lines 150 and 152 (FIG. 12) are in-phase or out-of-phase. Line 200 is then provided to A/D converter 160 and then to function generator 161, which provides, on bus 143, a digital signal with an independent value for each position the first 90 degrees of rotation of the air core gauge.

Figure 15:
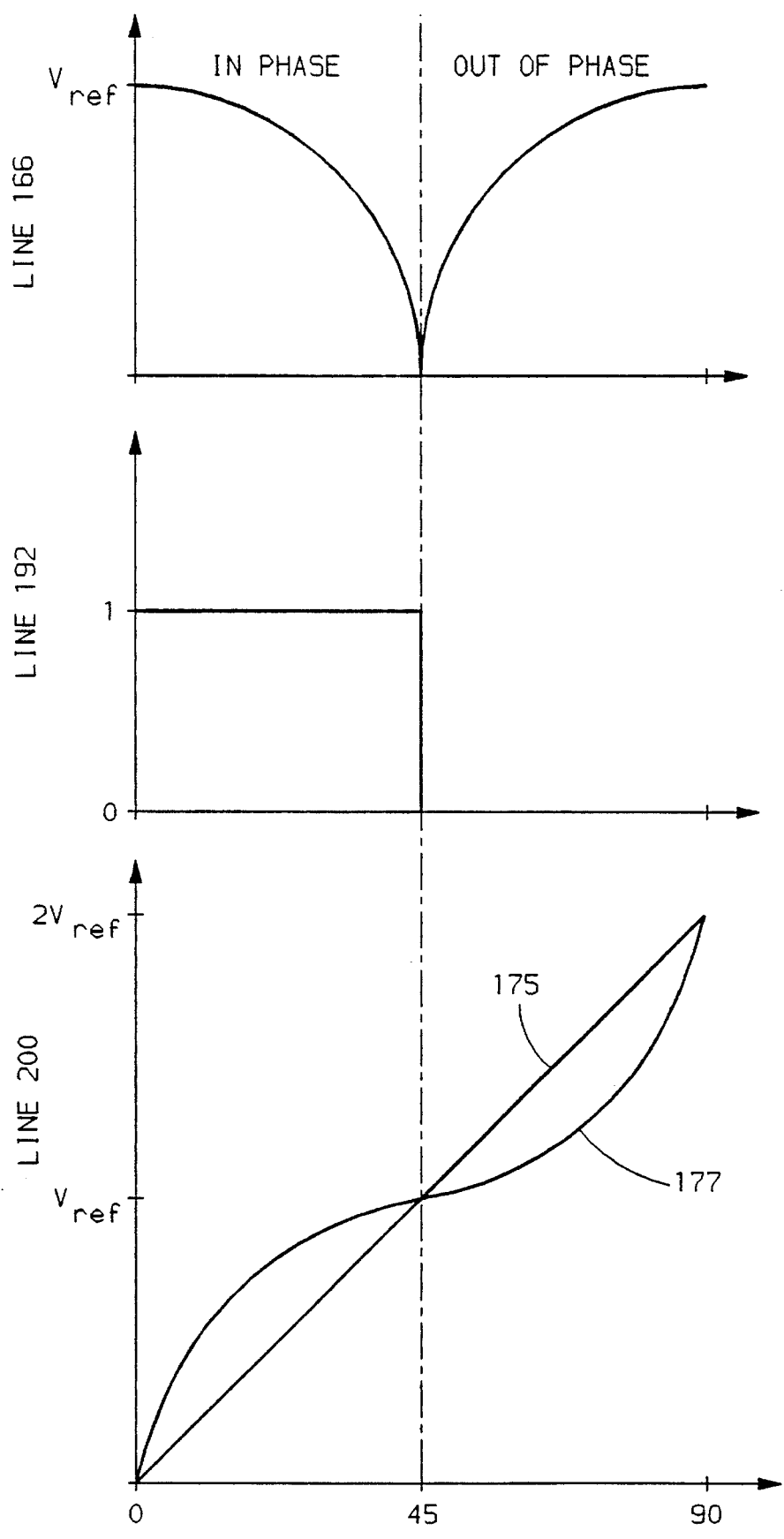
FIG. 15 is a timing diagram relating to the circuitry of FIG. 14.

FIG. 15 illustrates the output signals on lines 166, 192 and 200 for the circuitry show in FIG. 14. As can be seen, the output signal on line 200, reference 177, has an independent value for each position of the first 90 degrees of rotation of the air core gauge. The signal on line 200 is generally below $V_{REF}$ when the sine wave input and output signals on lines 150 and 152 are in-phase, which occurs in the first degrees of rotation, and the signal on line 200 is generally above the $V_{ref}$ when the sine wave signals on lines 150 and 152 are out-of-phase, which occurs between 45 and 90 degrees of gauge rotation. Reference 175 represents the output of function generator 161.

Figure 16:
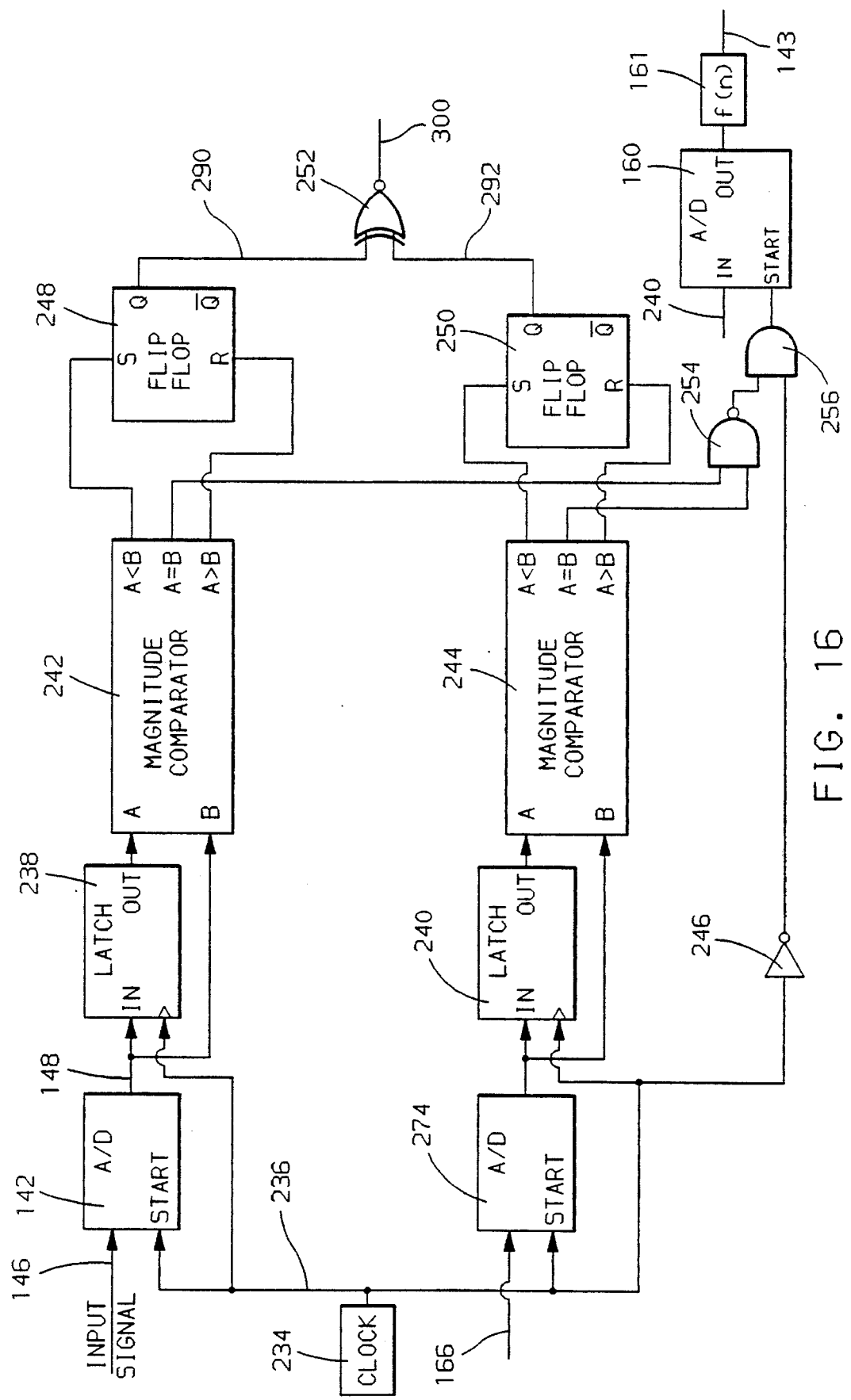
FIG. 16 illustrates additional position circuitry for use with this invention.
Figure 18:
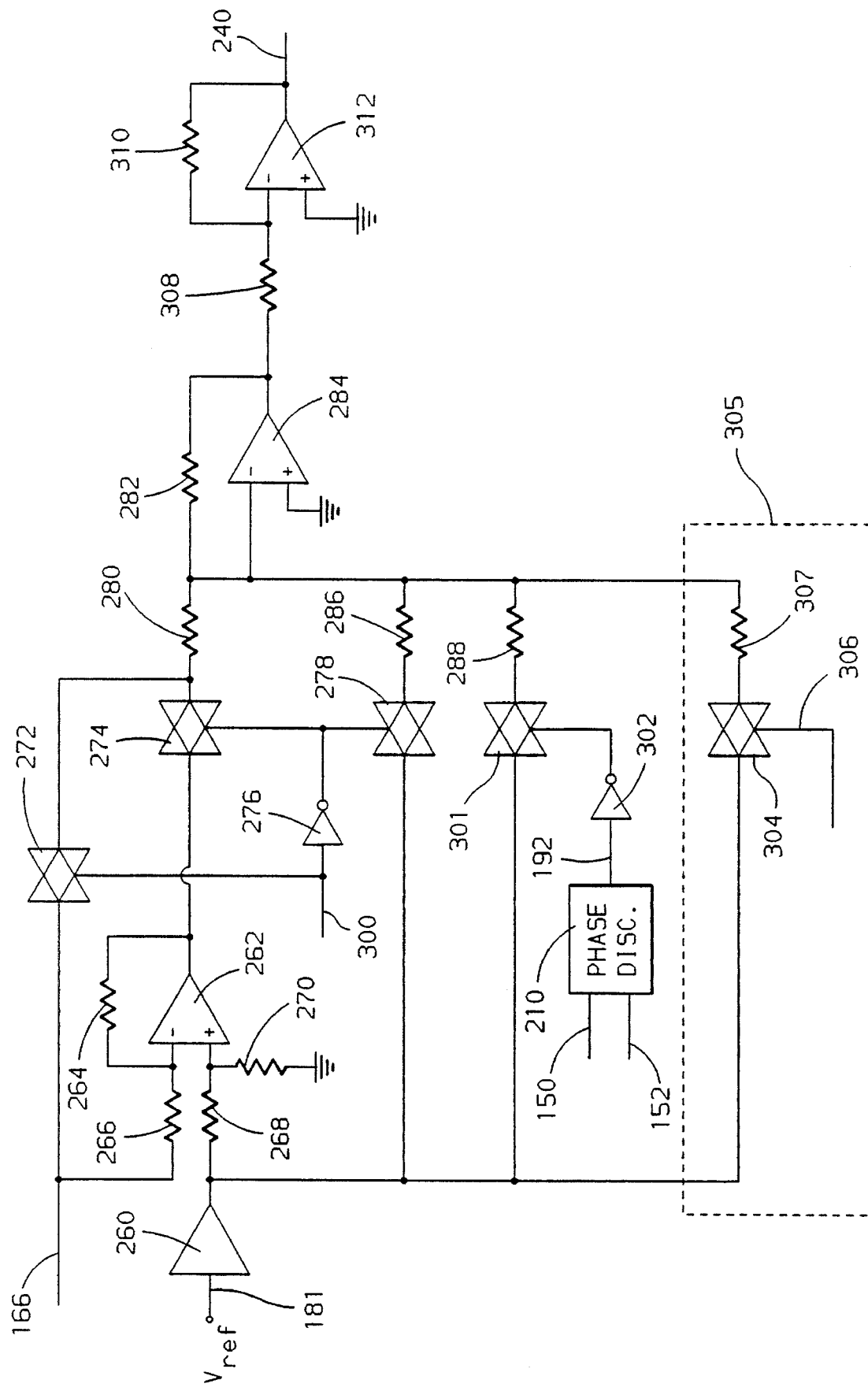
FIG. 18 illustrates additional position circuitry for use with this invention.

FIGS. 16 and 18 illustrate circuitry that, when used with the circuitry in FIGS. 11 and 12 and when coupled between line 166 and A/D converter 160, provides an independent output signal for each position of the first 180 degrees of rotation of the rotor 86, allowing closed loop positional control of the rotor 86 for the first 180 degrees of rotation. The portion of circuit shown in FIG. 18, represented by reference 305, is for use with the circuitry shown in FIG. 20 and allows closed loop control of rotor 86 position for complete 360 degrees of rotation of the rotor 86.

Referring to FIGS. 16 and 18 and the signal diagrams in FIGS. 17 and 19, the circuitry shown generally operates as follows.

The circuitry in FIG. 12 determines the ratio of the input and output signals on lines 150 and 152 and provides the ratio signal on line 166. The circuitry in FIG. 16 determines the direction of the respective slopes of the position input signal on line 146 and the output ratio on line 166 and provides an output signal on line 300 having a first state when the slopes of the signals on lines 146 and 166 are in the same direction (i.e., both slopes positive or both slopes negative) and having a second state when the slopes of the signals on lines 146 and 166 are in opposite directions (i.e., one slope positive and the other slope negative).

The circuitry shown in FIG. 18 uses the amplitude ratio for signals on lines 150 and 152, the phase difference between the signals on lines 150 and 152 and the relative slope information from the circuitry shown in FIG. 16 to provide an output signal on line 240 that has an independent value for each position of the first 180 degrees of rotation of the rotor 86. The portion represented by reference 305 will be ignored for now.

More particularly, referring to FIG. 16, the positional input signal on line 146 is input to A/D convertor 142 and the ratio signal on line 166 is input to A/D convertor 274. Clock 234 provides a clock pulse on line 236 with a rising edge responsive to which the A/D converters 142 and 274 lock in their respective input signals from lines 146 and 166. With the same rising edge, latches 238 and 240 latch in the previous A/D convertor signals from A/D convertors 142 and 274, respectively, providing to comparators 242 and 244, at the A inputs, signals representing the magnitude of the values on lines 146 and 166, respectively, for the previous clock pulse and signals at the B inputs representing the values on lines 144 and 166, respectively, for the current clock pulse.

Magnitude comparator 242 has three outputs: an A<B output, which goes high when the signal on line 146 has a rising slope; an A=B output, which goes high when the signal on line 146 has substantially zero slope; and an A>B output, which goes high when the signal on line 146 is decreasing or has a negative slope.

Similarly, magnitude comparator 244 has three outputs: an A<B output, which goes high when the signal on line 166 has a positive slope; an A=B output, which goes high when the signal on line 166 has substantially zero slope; and an A>B output, which goes high when the signal on line 166 has a negative slope. The magnitude comparators 242 and 244 control flip-flops 248 and 250, respectively, so that each flip-flop outputs a logic high signal to XNOR gate 252 when the slope of the signals on lines 146 and 166 are increasing and the flip-flops 248 and 250 output logic low signals to XNOR gate 252 when the signals on lines. 146 and 166 are decreasing. XNOR gate 252 receives either two high signals or two low signals from the flip-flops 248 and 250 when the slopes of the signals on lines 146 and 166 have the same direction. Responsively, the signal on line 300 goes high when both the signals on lines 146 and 166 are rising and when both the signals on lines 146 and 166 are falling. Otherwise, line 300 is low.

To stabilize the circuit when the signals on lines 146 and 166 remain relatively unchanged, the A equals B outputs of magnitude comparators 242 and 244 are coupled to NAND gate 254, providing an output to AND gate 256. The second input to AND gate 256 receives a second input from the inverted clock pulse through invertor 246. AND gate 256 inhibits updating A/D convertor 160 when both the signals on lines 146 and 166 are unchanging.

Invertor 246 inverts the clock pulse so that A/D convertors 142 and 274 can operate on the rising edge of the clock signal on line 236 and so that A/D convertor 160, when not inhibited by NAND gate 254 and AND gate 256, operates on the falling edge of the signal on line 236. This provides time for magnitude comparators 242 and 244 to operate and stabilize before A/D convertor 160 is updated.

The input signal, line 240, for A/D convertor 160 is provided by the circuitry described with respect to FIG. 18. The output of A/D convertor 160 is provided to a function generator 161, which may be an EEPROM look-up table or any other suitable type of function generator, to normalize the output of A/D converter 160 to amplifier 122 and/or the sine/cosine generator 110 in a manner known to those skilled in the art, if so desired.

Figure 17:
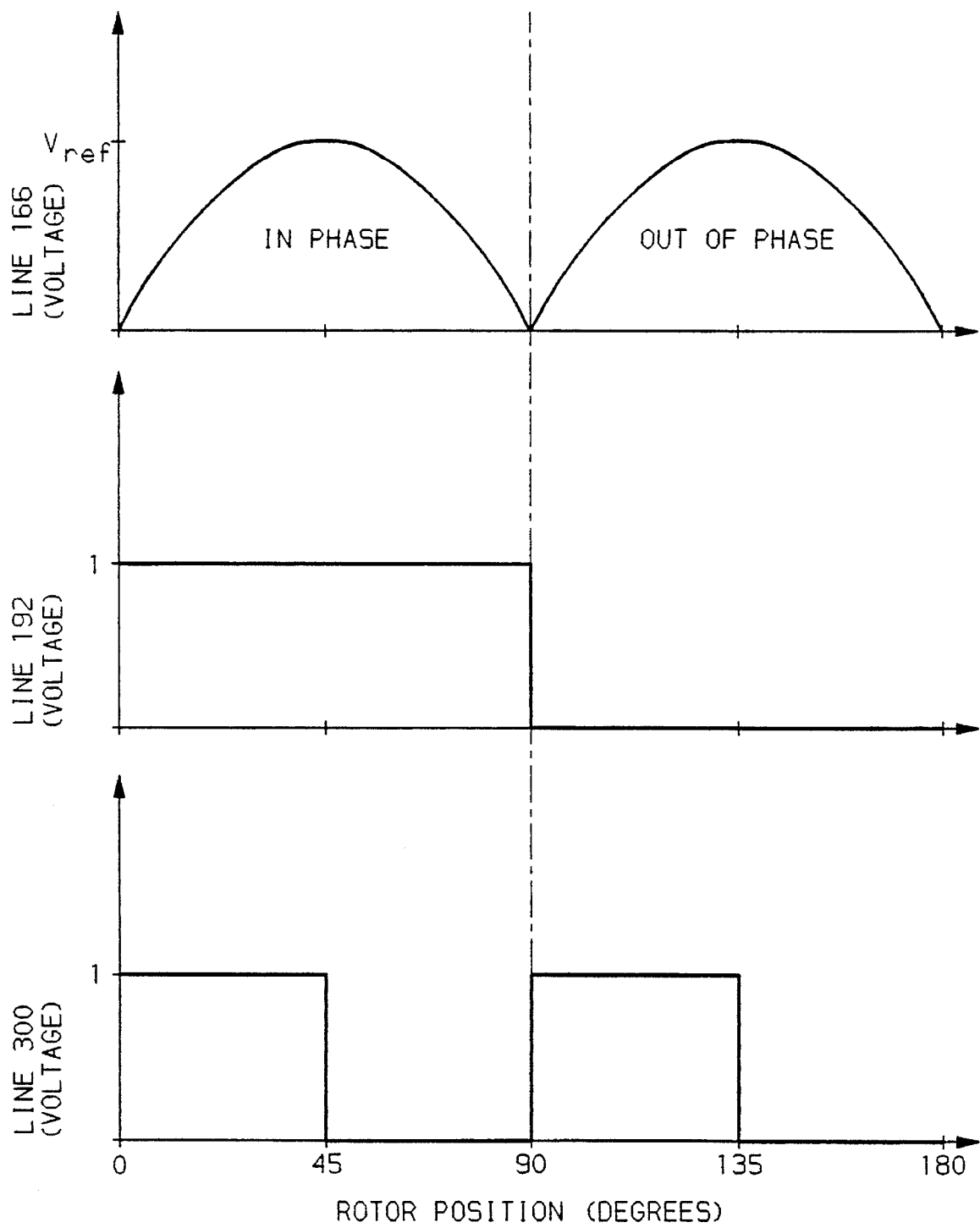
FIG. 17 is a timing diagram relating to the circuitry of FIG. 16.

The timing diagram in FIG. 17 illustrates the input signal on line 166, the phase signal on line 192, described below with reference to FIG. 18, and the slope signal on line 300.

Referring to FIG. 18, the portion of the circuitry shown responds to the phase discriminator 210 output on line 192 and the slope signal on line 300 to generally add one $V_{REF}$ value (from line 181) to the ratio signal on line 166 for each 45 degree advance in the rotation of the rotor 86. Likewise, the circuitry subtracts one $V_{REF}$ value on line 181 from the ratio signal for each 45 degrees of rotor 86 rotation in the reverse direction.

Figure 19:
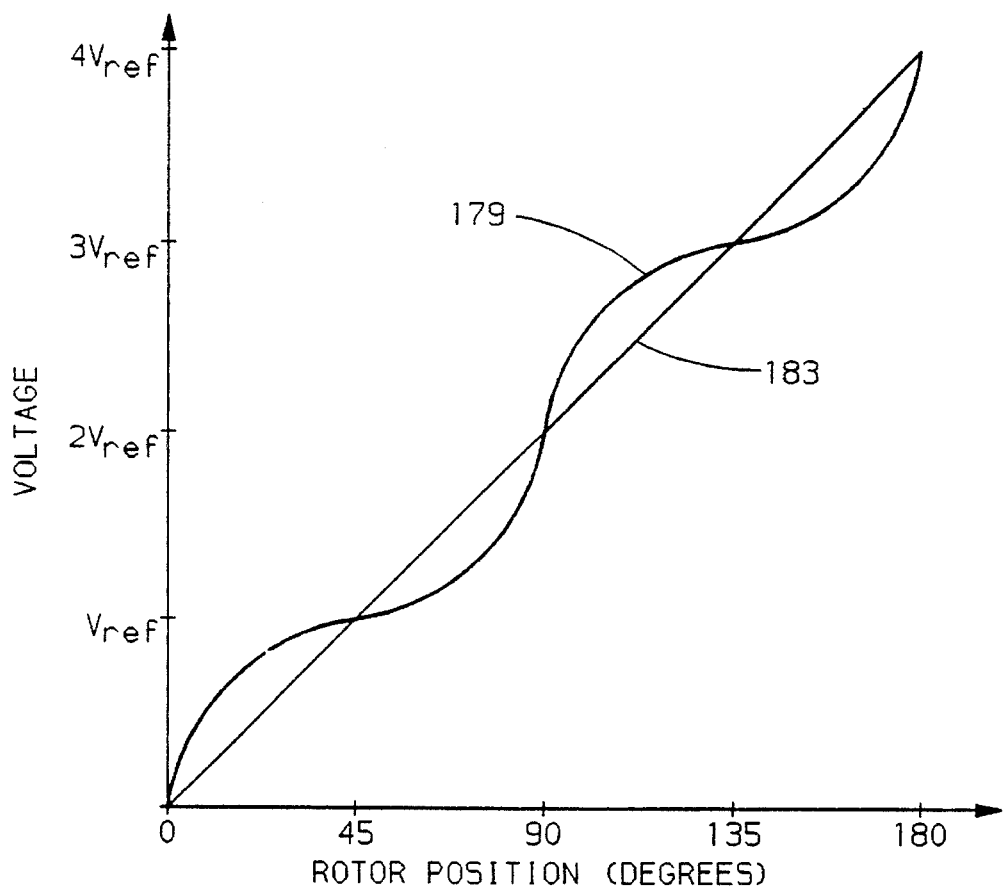
FIG. 19 is a graph of an output signal of the circuitry in FIG. 18.

Refer to FIG. 19, illustrating the output signal on line 240, reference 179, for the first 180 degrees of rotation compared with the output of function generator 161 in FIG. 16 shown as reference 183. For 0–45 degrees, the output signal on line 240 equals the value on line 166. For rotation between 45–90 degrees, the output signal on line 240 equals twice the reference voltage on line 181 minus the value of the signal on line 166. For rotation between 90–135 degrees, the output signal on line 240 equals twice the value of the reference signal on line 181 plus the value of the signal on line 166. For rotation between 135 and 180 degrees, the output signal on line 240 equals four times the value of the reference signal on line 181 minus the value of the signal on line 166.

Referring again to FIG. 18, the ratio signal on line 166 is subtracted from the reference signal on line 181, provided via buffer amplifier 260, by amplifier 262 and associated resistors 264, 266, 268 and 270, all having equal resistances, so that the output of amplifier 262 equals $V_{REF}-V_{166}$, which is provided to transmission gate 274. The ratio signal on line 166 is provided to transmission gate 272. The output of the buffer amplifier 260 is provided to transmission gates 278 and 301 and all of the transmission gates are coupled to summing amplifier 284 via resistors 280, 286 and 288.

Summing amplifier 284 includes associated resistor 282. The value of resistors 280, 282 and 286 are equal and the value of the resistor 288 is half that of 280, 282 and 286.

The slope signal on line 300 controls transmission gate 272 to selectively provide the signal on line 166 to summing amplifier 284. Line 300 also controls transmission gate 274 via invertor 276 to selectively provide, via resistor 280, the signal $V_{REF}-V_{166}$ to summing amplifier 284. The signal from line 166 is coupled to amplifier 284 when the slope signal indicates that the signals on lines 146 and 166 have slopes of the same sign. The signal $V_{REF}-V_{166}$ is coupled to amplifier 284 when the signal on line 300 indicates that the slopes of the signals on lines 146 and 166 do not have the same sign.

The signal $V_{REF}$ is selectively coupled to summing amplifier 284 via transmission gate 278, controlled by the signal on line 300 via invertor 276. Transmission gate 278 is controlled to couple $V_{REF}$ to amplifier 284 when the slope of the signal on line 146 is not of the same sign as the slope of the signal on line 166.

When the signals on lines 150 and 152 are out-of-phase, as determined by phase discriminator 210, invertor 302 activates transmission gate 301, coupling $V_{REF}$, via resistor 288, to summing amplifier 284.

Amplifier 312 and associated resistors 308 and 310 invert the output of amplifier 284, providing the signal on line 240 according to the illustration shown in FIG. 19. As can be seen, for each position of the first 180 degrees of rotation of the rotor 86, the output signal on line 240 provides an independent output value.

Figure 20:
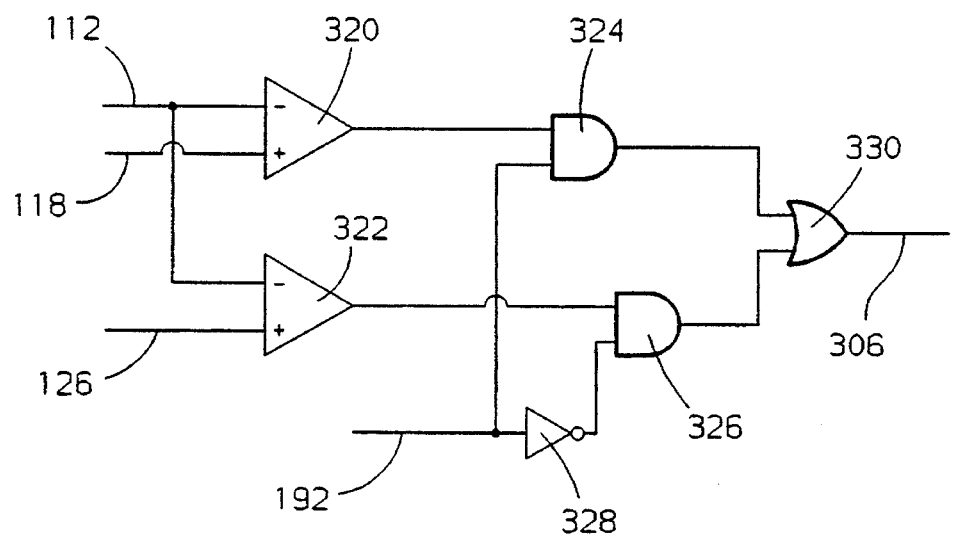
FIG. 20 illustrates additional position circuitry for use with this invention.
Figure 21:
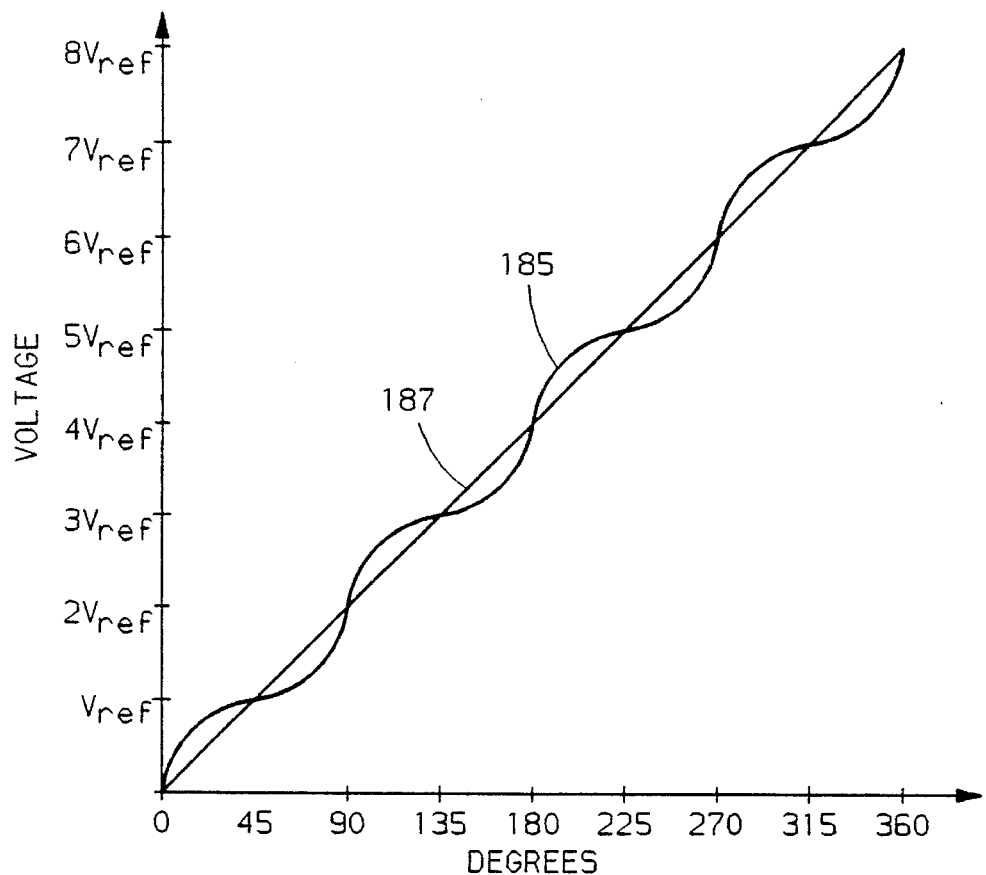
FIG. 21 is a graph of an output signal of the circuitry of FIGS. 18 and 20.

Referring now to FIG. 20, by adding quadrant detection circuitry to the circuitry shown in FIGS. 11, 12, 14 and 18, an independent output signal on line 240 is provided for each position of the rotor 86 during a complete 360 degrees of rotation. In general, the quadrant detection circuitry shown in FIG. 20 detects if the rotor 86 position is in the first 180 degrees or the second 180 degrees and adds four times the reference voltage to the output signal on line 240 if the rotor 86 is in the second 180 degrees of rotation, effectively extending the output signal on line 240 shown in FIG. 19 in the manner shown in FIG. 21 as reference 185, with reference 187 representing the output of function generator 161.

The circuit shown in FIG. 20 is coupled to lines 112, 118 and 126 in FIG. 11 and to line 192 in FIG. 18. Lines 112 and 118, the positive sine signal and negative cosine signal from sine-cosine generator 110, are input to differential amplifier 320 to provide a logic high output to AND gate 324 when the negative cosine signal is greater than the sine signal. The sine signal on line 112 and the cosine signal on line 126 are provided to differential amplifier 322, which outputs a logic high signal to an AND gate 326 when the cosine signal on line 126 is greater than the sine signal on line 112. The second input to AND gate 324 is controlled by the phase line 192 and the second input to AND gate 326 is controlled by the phase line 192 via invertor 328. AND gate 326 provides a high output signal when lines 152 and 150 are out-of-phase and when the signal level on line 112 is less than the signal level on line 126. AND gate 324 provides the high output signal when lines 152 and 150 are in-phase and when the signal on line 112 is less than the signal on line 118. The resultant output signal of OR gate 330 on line 306 is logic high when the rotor 86 rotational position is greater than 180 degrees and logic low when the rotor 86 rotational position less than 180 degrees.

Figure 22:
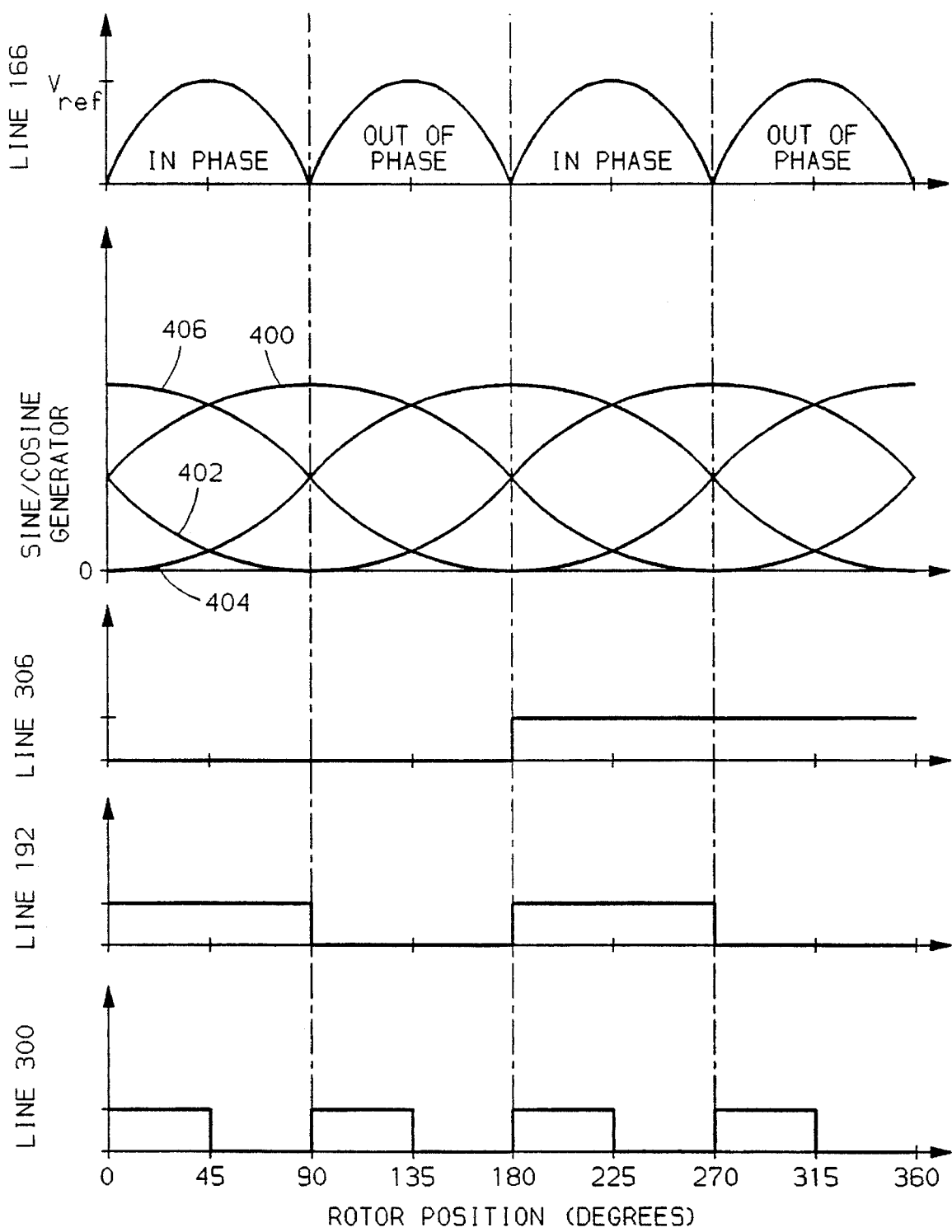
FIG. 22 is a graph of the output signals of the circuitry of FIGS. 11, 12, 16, 18 and 20.

Referring again to FIG. 18, signal line 306 controls transmission gate 304, which couples the signal $V_{REF}$ to summing amplifier 284 via resistor 307, having a resistance value one-quarter of that of resistors 280, 282 and 286. Thus, every time transmission gate 304 is active, the output signal on line 240 rises by a level of four times $V_{REF}$. The timing diagram in FIG. 22 illustrates the signal on line 166 and the signals 400, 402, 404 and 406, which are the outputs of the sine-cosine generator 110 lines 112, 114, 118 and 126 respectively through 360 degrees of rotation. FIG. 22 also illustrates the signal on line 306, the signal on line 192 and the signal on line 300. As can be seen, through 360 degrees of rotation, there is only one signal on line 240 for each position of the rotor 86.

The position signal on bus 143 enables control of the pointer through feedback, as illustrated in the circuits described above. Because the pointer position is controlled through feedback, errors in the position of the pointer can be eliminated and gauge designs can be simplified. For example, stray magnetic fields no longer need to be shielded against since feedback control enables corrections for errors induced by such stray fields.

Figure 23:
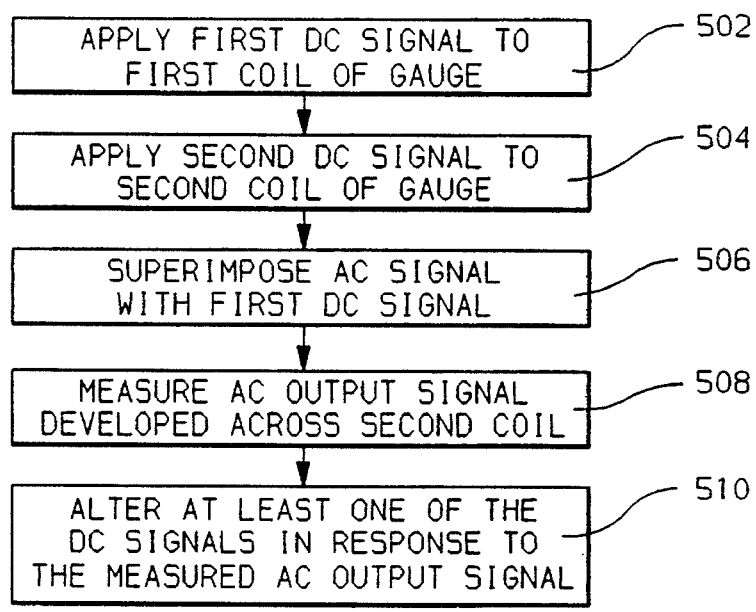
FIG. 23 illustrates the method of this invention with steps 502–510.

FIG. 23 illustrates the steps of the method of this invention implemented in the above described circuits, comprising the steps of applying a first DC signal to a first coil of a gauge (block 502), applying a second DC signal to a second coil of a gauge (block 504), superimposing an AC signal with the first DC signal (block 506), measuring an AC output signal developed across the second coil of the gauge (block 508), and altering at least one of the DC signals in response to the measured AC output signal (block 510).

The above examples are descriptions of the preferred embodiments of this invention and are not limiting on its scope. For example, the zero position of the rotor 86 can be at any point, not just a maximum ratio point or a minimum ratio point. Different zero positions of the rotor 86 may be easily offset by varying the function of the function generator 161. Moreover, various other improvements and modifications to this invention will occur to those skilled in the art and fall within the scope of this invention as set forth below.

The embodiments of the invention in which an exclusive property or privilege is claimed are defined as follows:

1. An apparatus comprising:

an air core gauge comprising at least two coils, including a first coil that is perpendicular to and cross wound over a second coil, the first and second coils mounted in proximity of a rotatably mounted two pole permanent magnet rotor having a circular cylindrical shape, the rotor rotating in response to a magnetic field having a composite magnetic vector, the magnetic field created by DC currents flowing through the coils, the rotor rotating to align itself with the composite magnetic vector;

means, coupled to the first and second coils, for respectively supplying first and second DC signals to the first and second coils, wherein the coils create the composite magnetic field having the composite magnetic vector with which the permanent magnet rotor rotates to align itself, the first and second DC signals being supplied in response to an input signal representing a desired rotational position for the permanent magnet rotor;

means, coupled to the first coil, for generating an AC input signal and applying the AC input signal across the first coil to develop an AC output signal across the second coil, the current flowing through the first coil having a DC component and an AC component, the rotation of the permanent magnet rotor not being affected by the AC component, and the AC output signal having a magnitude that varies in relation to an actual rotational position of the permanent magnet rotor;

means coupled to the second coil for detecting the magnitude of the AC output signal and for controlling the DC signals applied to the first and second coils in response to the detected magnitude of AC output signal and the input signal to move the actual rotational position of the permanent magnet rotor to the desired rotational position.

2. An Apparatus comprising:

a rotatably mounted magnetic rotor formed from a permanent magnet;

a first coil mounted in proximity of the magnetic rotor, the first coil mounted such that, if the first coil is flowing with electric current, the magnetic rotor is within immediate proximity of at least part of a magnetic field created by the first coil;

a second coil mounted in proximity of the magnetic rotor, the second coil mounted such that, if the second coil is flowing with electric current, the magnetic rotor is within immediate proximity of at least part of a magnetic field created by the second coil;

means, coupled to the first coil, for generating an AC input signal and applying the AC input signal across the first coil to develop an AC output signal across the second coil, the AC output signal having a magnitude that varies in relation to the rotational position of the rotor;

means coupled to the second coil for detecting the magnitude of the AC output signal and for determining the rotational position of the rotor based upon the magnitude of the AC output signal; and wherein the AC input signal has a magnitude and the means for determining the rotational position of the rotor further includes means coupled to the first toil for detecting the magnitude of the AC input signal, with the rotational position of the rotor being determined based upon a ratio of the magnitude of the AC output signal to the magnitude of the AC input signal.

3. The apparatus of claim 2 wherein the rotor is a two pole magnetic rotor.

4. The apparatus of claim 2 wherein the magnetic rotor is of circular cylinder shape.

5. The apparatus of claim 2 wherein the first coil is perpendicular to and cross wound over the second coil and the rotor is within the two coils.

6. The apparatus of claim 2 wherein the rotor is positioned in response to first and second DC signals respectively applied across the first and second coils.

7. The apparatus in claim 2 wherein the means for detecting the AC output signal is a display, coupled to the second coil, displaying the rotational position of the rotor in response to the magnitude of the AC output signal.

8. A method of operating an air core gauge having a permanent magnet rotor and coils for receiving signals to rotatably position the rotor relative to the coils, comprising the steps of:

applying a first DC signal to a first coil and a second DC signal to a second coil to rotate the permanent magnet rotor to an actual rotational position in response to an input signal, the input signal representing a desired rotational of the permanent magnet rotor;

superimposing an AC input signal with the first DC signal applied to the first coil;

detecting an AC output signal developed across the second coil in response to the AC input signal and the actual rotational position of the permanent magnet rotor; and generating a measured position signal in response to the detected AC output signal, the measured position signal representing the actual rotational position of the permanent magnet rotor.

9. The method of claim 8, also comprising the steps of:

developing an error signal in response to the input signal and the measured position signal, the error signal representing the difference between the desired and actual rotational positions of the permanent magnet rotor; and altering the DC signals applied to coils in response to the the error signal to eliminate the difference between the desired and actual rotational positions of the permanent magnet rotor.

\* \* \* \* \*